United States Patent
Sugihashi

[11] Patent Number: 5,963,063
[45] Date of Patent: Oct. 5, 1999

[54] SAMPLE AND HOLD CIRCUIT HAVING A WAVEFORM SHAPING CIRCUIT

[75] Inventor: Fujihiko Sugihashi, Kashiwa, Japan

[73] Assignee: Texas Instruments Incorporated, Dallas, Tex.

[21] Appl. No.: 08/918,443

[22] Filed: Aug. 26, 1997

[51] Int. Cl.$^6$ .................................................. G11C 27/02
[52] U.S. Cl. .............................. 327/94; 327/170; 327/437
[58] Field of Search ................................. 327/91, 94, 170, 327/404, 436, 437, 415, 416; 326/87; 341/122–125

[56] References Cited

U.S. PATENT DOCUMENTS

| | | | |
|---|---|---|---|
| 4,467,227 | 8/1984 | Lewyn et al. | 327/389 |
| 4,823,027 | 4/1989 | Takahashi | 327/94 |

*Primary Examiner*—Kenneth B. Wells
*Assistant Examiner*—Minh Nguyen
*Attorney, Agent, or Firm*—Bret J. Petersen; William B. Kempler; Richard L. Donaldson

[57] ABSTRACT

A waveform shaping circuit free of error in the hold capacitor due to parasitic capacitance of the MOSFET transistor. Waveform shaping circuit 3 has a constitution that it has XSEL signal and SEL signal input to it, with XSEL signal in a stable state at either a first logic level, or a second logic level with the second logic level opposite to the first logic level; it has the logic level displayed by said SEL signal output as the OUT signal; and it has the logic level displayed by said XSEL signal output as the XOUT signal; in this waveform shaping circuit, the constitution is such that in the transient state in which said XSEL signal starts logic inversion and then said SEL signal starts logic inversion, upon detection of the start of logic inversion of said XSEL signal, a change is started in the logic level of said OUT signal and the logic level of said XOUT signal; then, upon detection of start of the logic inversion of said SEL signal, the logic level of said OUT signal and the logic level of said XOUT signal are further changed. The logic inversion of said OUT signal and the logic inversion of said XOUT signal start and complete at the same time. Consequently, there is no error in the voltage of hold capacitor $C_H$.

9 Claims, 2 Drawing Sheets

SAMPLE AND HOLD CIRCUIT HAVING A WAVEFORM SHAPING CIRCUIT

FIELD OF THE INVENTION

This invention pertains to the technical field of sample and hold circuits. In particular, this invention pertains a type of waveform shaping circuit which shapes the signals that are formed from the sample/hold signal and displays the logic levels complementary to each other, and a sample and hold circuit, which makes use of the aforementioned waveform shaping circuit.

BACKGROUND OF THE INVENTION

Usually, a sample and hold circuit is arranged in the input section of A/D converter or other converting device. It samples the input voltage at a prescribed timing, and holds the sampled voltage until the end of the conversion by the converting device. In FIG. 4(a), 102 represents a conventional sample and hold circuit.

Said sample and hold circuit 102 has a constitution comprising hold capacitor 106, analog switch 107, switch control circuit 120, and output circuit 115. When analog switch 107 is in the conductive state, sampling voltage $V_{IN}$ charges or discharges hold capacitor 106. On the other hand, when analog switch 107 is in the cutoff state, the charge stored in the hold capacitor 106 is maintained, and, by means of output circuit 115, the hold voltage of hold capacitor 106 is output to the next circuit stage.

This operation is performed under instruction of the sample/hold signal. The sample/hold signal is input to an inverter 121 in the switch control circuit 120.

Inverter 121 inverts the input sample/hold signal, and outputs it as the XOUT signal. This XOUT signal is output to analog switch 107 and inverter 123, said inverter 123 is inverted again, and the obtained signal is output as OUT signal to analog switch 107.

Analog switch 107 has a constitution with a p-channel MOSFET $111_p$ and n-channel MOSFET MOSFET $111_n$ connected in parallel. XOUT signal is input to the gate terminal of p-channel MOSFET $111_p$, and OUT signal is input to the gate terminal of n-channel MOSFET $111_n$.

Since the OUT signal is formed by inverting the XOUT signal using inverter 123, in the steady state, the logic level of XOUT signal and the logic level of OUT signal are opposite (complementary) to each other. Also, since the XOUT signal is formed by inverting the sample/hold signal using inverter 121, when the sample/hold signal is in the high level, XOUT signal is in the low level, and the OUT signal is in the high level. Consequently, when the sample/hold signal is in the high level, p-channel MOSFET $111_p$ and n-channel MOSFET $111_n$ are turned ON, and analog switch 107 becomes conductive. On the other hand, when the sample/hold signal is in the low level, XOUT signal goes high, while OUT signal goes low, both p-channel MOSFET $111_p$ and n-channel MOSFET $111_n$ are both OFF, and analog switch 107 becomes nonconductive.

In this way, as the state of the sample/hold signal is controlled to the high level (sample) and the low level (hold), p-channel MOSFET $111_p$ and n-channel MOSFET $111_n$ are turned ON/OFF, and analog switch 107 can be switched to the conductive state and cutoff (nonconductive) state. Consequently, it is possible to charge or discharge sample hold capacitor 106 and to maintain the voltage.

For the aforementioned XOUT signal and OUT signal, the high level refers to the level of voltage $V_{DD}$ on the high potential side of the power source. On the other hand, the low level refers to the level of voltage $V_{SS}$ on the low potential side of the power source ($V_{DD} > V_{SS}$). Usually, in order to turn the MOSFET ON, it is necessary to apply a voltage higher than the threshold voltage between source and gate. In p-channel MOSFET $111_p$ and n-channel MOSFET $111_n$ of said analog switch 107, the source potential varies corresponding to input voltage $V_{IN}$. Consequently, when the voltage between the souce and gate is lower than threshold voltages $V_{th}(p)$ and $V_{th}(n)$, it cannot become ON. The output voltage of p-channel MOSFET $111_p$ takes on the range of symbol $V_p$ shown in FIG. 4(b), and the output voltage of n-channel MOSFET $111_n$ takes on the range of symbol $V_n$.

Consequently, when sample voltage $V_{IN}$ becomes near $V_{DD}$, sampling is performed by p-channel MOSFET $111_q$ [sic; $111_p$] alone; when it becomes near $V_{SS}$ sampling is performed by n-channel MOSFET $111_n$ alone. In this way, by connecting p-channel MOSFET $111_p$ and n-channel MOSFET $111_n$, the ranges of their output voltages Vn and Vp complement with each other to fill the range, sampling can be made in the voltage range of $V_{SS}$–$V_{DD}$ in this constitution.

In this way, when said analog switch 107 is shifted from the conductive state to the cutoff state, as the sample/hold signal is inverted from the high level to the low level, first of all, XOUT signal makes a logic inversion from the low level (voltage $V_{SS}$) to the high level (voltage $V_{DD}$), p-channel MOSFET $111_p$ is turned OFF before n-channel MOSFET $111_n$. In this case, the parasitic capacitance 112p formed between the gate terminal and drain terminal of p-channel MOSFET $111_p$ is charged (discharged).

When said parasitic capacitance $112_p$ is charged (dischargeed), as n-channel MOSFET $111_n$ is ON, the current accompanying discharge (charging) of the parasitic capacitance flows through n-channel MOSFET $111_n$, and there is no change in the hold voltage.

Then, after delay by the operation time of inverter 123, logic inversion is made from the high level to the low level, and n-channel MOSFET $111_n$ is OFF. In this case, the parasitic capacitance 112n formed between the gate terminal and source terminal of n-channel MOSFET $111_n$ is charged (discharged). When n-channel MOSFET $111_n$ is OFF, as p-channel MOSFET $111_p$ is already OFF, current (i) in the case of discharging (charging) parasitic capacitance 112n flows through hold capacitor 106, and the voltage of hold capacitor 106 varies. As aforementioned, when the p-channel MOSFET is first OFF, the hold voltage level becomes lower than sampling voltage $V_{IN}$, and there is an error in the hold voltage.

In this way, as the levels of power source voltages $V_{DD}$ and $V_{SS}$ vary, the error voltage also varies, and it is impossible to correct it. Consequently, efforts are made intended to solve the problem, for example, by using a hold capacitor having a capacitance larger than the parasitic capacitance. However, in this case, the chip area becomes larger than that in the case when the hold capacitor is arranged on the chip. This problem must be solved.

The purpose of this invention is to solve the aforementioned problems of the conventional methods by providing a type of waveform shaping circuit which is free of error in the sample and hold voltage, and a type of sample and hold circuit which uses the waveform shaping circuit.

SUMMARY OF INVENTION

An embodiment of the invention provides a sample and hold circuit characterized by the following facts: the sample and hold circuit has a hold capacitor, an analog switch with an n-channel MOSFET and a p-channel MOSFET connected in parallel, and the waveform shaping circuit described in claim 1 or 2; in this sample and hold circuit, said SEL signal is formed as said XSEL signal is inverted by an inventor; said analog switch has a constitution such that it is made conductive state and blocker state (nonconductive) corresponding to the logic level of said XOUT signal and the logic level of said OUT signal state; and said hold capacitor has a constitution such that when said analog switch is conductive, charging/discharge takes place at the voltage to be sampled; and, when said analog switch is set in the cutoff state, the voltage is maintained.

As aforementioned, in the waveform shaping circuit of this invention has a constitution that it has XSEL signal and SEL signal input to it, with XSEL signal in a stable state in either a first logic level, which indicates either low logic level or high logic level, or a second logic level with the second logic level opposite to the first logic level; it has the logic level displayed by said SEL signal output as the OUT signal, and it has the logic level displayed by said XSEL signal output as the XOUT signal; in this waveform shaping circuit, when said XSEL signal starts logic inversion from the first logic level to the second logic level, and then said SEL signal starts logic inversion from the second logic level to the first logic level, first of all, upon detection of the start of logic inversion of said XSEL signal, a change is started for the logic level of said OUT signal and the logic level of said XOUT signal; then, upon detection of the start of the logic inversion of said SEL signal, the logic level of said OUT signal and the logic level of said XOUT signal are further changed; hence, logic inversion of said OUT signal and logic inversion of said XOUT signal are started at the same time, and they are completed also at the same time.

In this way, OUT signals and XOUT signals that change at the same time are input to the n-channel MOSFET and p-channel MOSFET of the analog switch, and the n-channel MOSFET and p-channel MOSFET are turned OFF at the same time, their currents flowing through the parasitic capacitor cancel each other, so that no error takes place in the hold voltage of the hold capacitor connected to the analog switch.

In this case, when said XSEL signal starts logic inversion from the second logic level to the first logic level, and then said SEL signal starts logic inversion from the first logic level to the second logic level, first of all, upon detection of the start of logic inversion of said XSEL signal, a change is started in the logic level of said OUT signal and the logic level of said XOUT signal; then, upon detection of the start of the logic inversion of said SEL signal, the logic level of said OUT signal and the logic level of said XOUT signal are further changed; hence, logic inversion of said OUT signal from the first logic level to the second logic level, and logic inversion of said XOUT signal from the second logic level and the first logic level are started at the same time, and they are completed also at the same time. Consequently, it is possible to turn on the n-channel MOSFET and p-channel MOSFET of said analog switch.

DESCRIPTION OF EMBODIMENTS

In the following, an embodiment of this invention will be explained with reference to FIGS.

Figure 1:
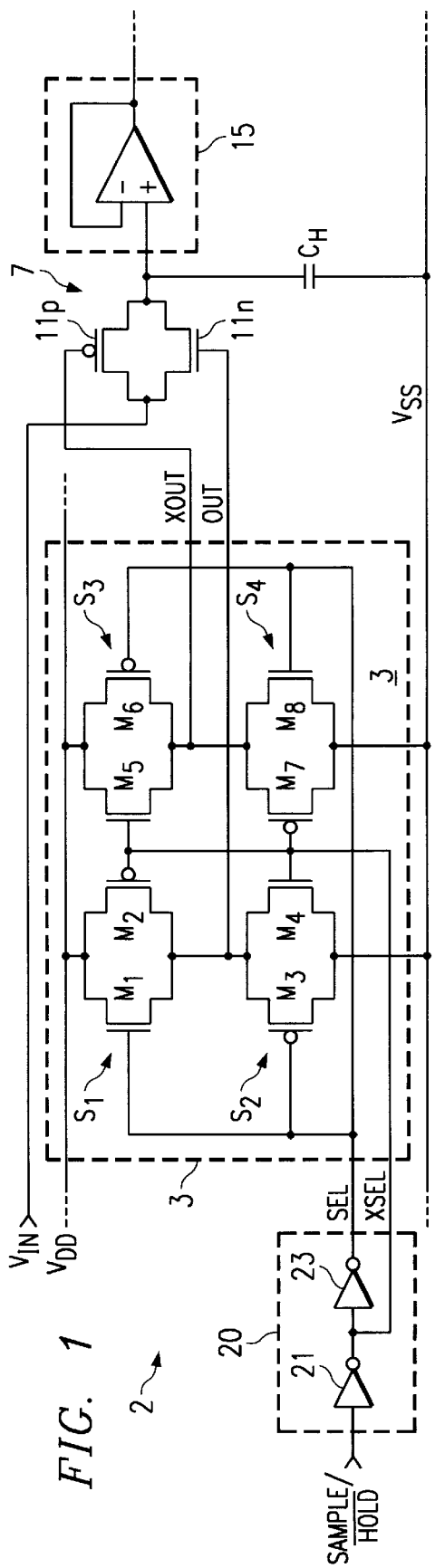
FIG. 1 is a circuit block diagram illustrating an example of the waveform shaping circuit and sample and hold circuit of this invention.
Figure 2:
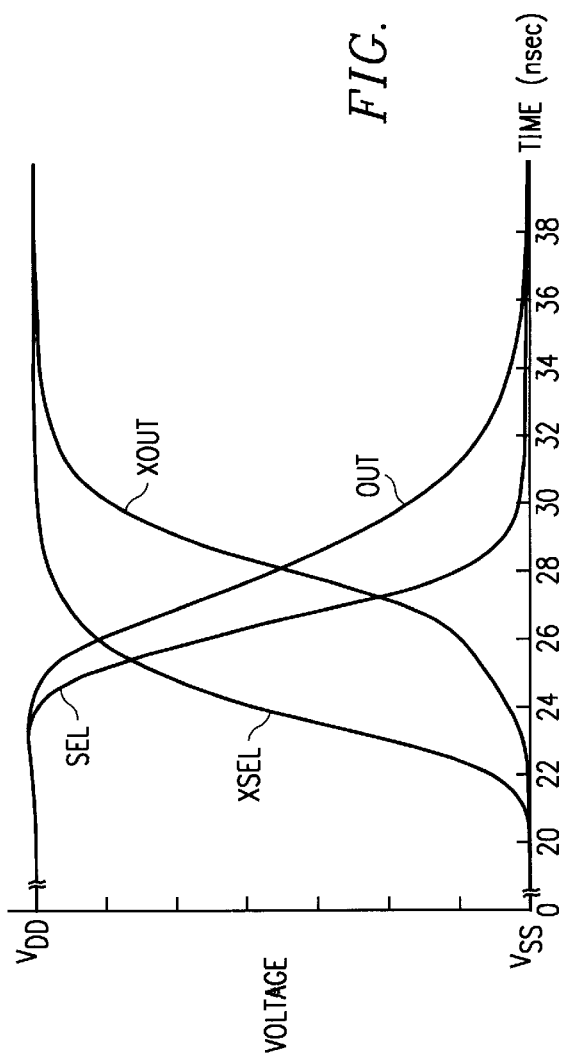
FIG. 2 is a time sheet illustrating the operation of the waveform shaping circuit and sample and hold circuit of this invention.

In FIGS. 1, 2 represents the sample and hold circuit in an embodiment of this invention. This sample and hold circuit 2 has switch controller 20, analog switch 7, output circuit 15, hold capacitor $C_H$, and waveform shaping circuit 3 as an example of this invention.

In this constitution, as the sample/hold signal that indicates either the sampling operation or the hold operation is input to said sample and hold circuit 2, if the sample/hold signal is in the high level (voltage of $V_{DD}$), hold capacitor $C_H$ is charged/discharged by sampling voltage $V_{IN}$ (sampling operation); and, if the sample/hold signal is at low level (voltage of $V_{SS}$) the hold voltage appearing on hold capacitor $C_H$ is maintained (hold operation) in this constitution. In the following, the content of the operation will be explained together with the constitution of sample and hold circuit 2.

Said switch controller 20 comprises inverters 21 and 23 connected in series in this order. Said sample/hold signal is input to inverter 21 in the former stage, and the signal inverted by said inverter 21 is output as XSEL signal. Said XSEL signal is input to waveform shaping circuit 3 and inverter 23 in the latter stage. The signal inverted by said inverter 23 is output as SEL signal, which is input to waveform shaping circuit 3.

Waveform shaping circuit 3 has switches $S_1$–$S_4$. Switches $S_1$ and $S_2$ are connected in series in this order between the wire with voltage $V_{DD}$ applied on the higher potential side of the power source and the wire with voltage $V_{SS}$ applied on the lower potential side of power source. Also, similarly, switches $S_3$ and $S_4$ are connected in series in this order between the wire applied with voltage $V_{DD}$ and the wire applied with voltage $V_{SS}$.

Switches $S_1$–$S_4$ have n-channel MOSFETs $M_1$, $M_4$, $M_5$, $M_8$ and p-channel MOSFETs $M_2$, $M_3$, $M_6$, $M_7$, respectively. The drain terminals and source terminals of n-channel MOSFETs $M_1$, $M_4$, $M_5$, $M_8$ are connected to the source terminals and drain terminals of p-channel MOSFETs $M_2$, $M_3$, $M_6$, $M_7$, respectively. Each of switches $S_1$–$S_4$ is made of two MOSFETs connected in parallel.

The constitution is such that the SEL signal is input to the gate terminals of n-channel MOSFETs $M_1$, $M_8$ of switches $S_1$ and $S_4$ and the gate terminals of p-channel MOSFETs $M_3$, $M_6$ of switches $S_2$ and $S_3$. On the other hand, the XSEL signal is input to the gate terminals of p-channel MOSFETs $M_2$, $M_7$ of switches $S_1$ and $S_4$ and the gate terminals of n-channel MOSFETs $M_4$, $M_5$ of switches $S_2$ and $S_3$. When the SEL signal is high level and the XSEL signal is at low level, switches $S_1$ and $S_4$ become ON, and switches $S_2$ and $S_3$ turn OFF. When the logic levels of the SEL signal and the XSEL signal are opposite to each other, switches $S_2$ and $S_3$ turn ON, and switches $S_1$ and $S_4$ turn OFF.

Consequently, in the steady state in which the logic level of the SEL signal and the logic level of the XSEL signal are opposite to each other, either the switches $S_1$ and $S_4$ as a group are ON at the same time, or switches $S_2$ and $S_3$ as a group are ON at the same time.

From the middle point of connection between switches $S_1$ and $S_2$, the OUT signal is output, and, from the middle point of connection between switches $S_3$ and $S_4$, XOUT signal is output. Consequently, when the group of switches $S_1$ and $S_2$ are ON, the OUT signal is at high level, and the XOUT signal goes to low level. When the group of switches $S_2$ and $S_3$ are ON, XOUT signal is at high level. That is, the constitution is such that in the steady state, the OUT signal and the XOUT signal are at opposite logic levels.

In analog switch 7, p-channel MOSFET 11$_p$ and n-channel MOSFET 11$n$ have their source terminals and drain terminals connected together to form a parallel connection. The OUT signal is input to the gate terminal of n-channel MOSFET 11$_n$, and the XOUT signal is input to the gate terminal of p-channel MOSFET 11$_p$.

Consequently, for said analog switch 7, when the XOUT signal is at low level and OUT signal is at high level, both p-channel MOSFET 11$_p$ and n-channel MOSFET 11$n$ are ON, and the overall analog switch becomes conductive, and hold capacitor $C_H$ is charged/discharged to/from sample voltage $V_{IN}$. On the other hand, when the XOUT signal is at high level and OUT signal is at low level, both p-channel MOSFET 11$_p$ and n-channel MOSFET 11$_n$ are in the cutoff state. The level of the hold voltage appearing at hold capacitor $C_H$ is maintained, and the hold voltage is output to the external circuit through output circuit 15 having a high input impedance.

Now, the sample/hold signal is stable in the high level (sampling operation). When the sample signal is stable at high level, the XSEL signal is stable at the first logic level, that is, the low level, and the SEL signal is stable at the second logic level, that is, the high level. In this case, switches $S_1$ and $S_4$ are ON, and switches $S_2$ and $S_3$ are OFF. The OUT signal is output at the high level displayed by the SEL signal, and the XOUT signal is output of the low level displayed by the XSEL signal.

Consequently, both n-channel MOSFET 11$_n$ and p-channel MOSFET 11$_p$ are ON, and the analog switch 7 is conductive. Consequently, the voltage of sample capacitor $C_H$ takes on the same potential as that of sample voltage $V_{IN}$, and the hold voltage becomes identical to sample voltage $V_{IN}$.

When the sample/hold signal is switched to low level (hold operation) from this state, first of all, logic inversion starts for the XSEL signal from the low level to the high level by means of inverter 21. Then, after a delay time of inverter 23, logic inversion starts for the SEL signal from the high level to the low level.

In this case, FIG. 2 illustrates an example of the waveforms of the SEL signal and XSEL signal. FIG. 2 shows the results of simulation. Change takes place for the XSEL signal at near 21 ns and for the SEL signal at near 24 nsec (nanoseconds) on the time axis (abscissa), and the start of logic inversion of the SEL signal is later by 3 nsec than start of logic inversion of the XSEL signal.

The various MOSFETs $M_1$–$M_8$ of waveform shaping circuit 3 having said SEL signal and XSEL signal input to it are formed on a single silicon substrate. The highest voltage $V_{DD}$ is applied to the back gates of p-channel MOSFETs $M_2$, $M_3$, $M_6$, $M_7$, and the lowest voltage $V_{SS}$ is applied to the back gates of n-channel MOSFETs $M_1$, $M_4$, $M_5$, $M_8$.

Also, said MOSFETs $M_1$–$M_8$ are formed such that they have the same driving power. More specifically, the same voltage is applied between source and drain, and the MOSFETs are designed such that the drain currents that flow through them are equal to each other under the same operation conditions with the same voltage applied between source and drain.

In the steady state, when the stable state is reached with switches $S_1$ and $S_4$ ON and switches $S_2$ and $S_3$ OFF, voltage $V_{DD}$ is applied to the drain terminals of n-channel MOSFETs $M_4$, $M_5$, and voltage $V_{SS}$ is applied to the source terminals. Consequently, the operation conditions of n-channel MOSFETs $M_4$ and $M_5$ become the same. When the source-gate voltage of n-channel MOSFETs $M_4$ and $M_5$ becomes higher than the threshold voltage due to variation in the XSEL signal, said n-channel MOSFETs $M_4$ and $M_5$ begin to turn ON at the same time.

Since n-channel MOSFETs $M_4$ and $M_5$ turn ON at the same time, the logic level of the OUT signal and the logic level of the XOUT signal start changing at the same time. After that, the voltage of the SEL signal starts changing.

When OUT signal and XOUT signal start changing, the source-drain voltage of p-channel MOSFET $M_3$ and the source-drain of p-channel MOSFET $M_6$ are nearly equal to each other, and the operation conditions of the two p-channel MOSFETs $M_3$ and $M_6$ are nearly identical to each other. Due to change in the SEL signal, the source-gate voltages of p-channel MOSFETs $M_3$ and $M_6$ become higher than the threshold voltage, and p-channel MOSFETs $M_3$ and $M_6$ turn ON almost at the same time.

When p-channel MOSFETs $M_3$ and $M_6$ turn ON, the voltage of the OUT signal, which has started falling due to n-channel MOSFET $M_4$ falls further. At the same time, the voltage the of XOUT signal, which has started rising due to n-channel MOSFET $M_5$, rises further.

As the voltage of XSEL signal further rises, first, p-channel MOSFETs $M_2$ and $M_7$ of switches $S_1$ and $S_4$ are OFF, the voltage of the OUT signal falls, and, at the same time, the voltage of the XOUT signal rises.

Then, the voltage of the SEL signal falls, n-channel MOSFETs $M_1$, $M_8$ of switches $S_1$ and $S_4$ are OFF, the voltage of the OUT signal falls further, and, at the same time, the voltage of XOUT signal rises further. In this way, the inversion of the OUT signal and the XOUT signal is completed.

The results of simulation of the changes in the OUT signal and the XOUT signal are shown overlapped on the timing chart of FIG. 2. It can be seen that the inversion operations of the OUT signal and XOUT signal take place at the same time.

In this way, the inversion of the OUT signal and the inversion of the XOUT signal are started and completed at the same time. Consequently, p-channel MOSFET 11$_p$ and n-channel MOSFET 11$_n$ of analog switch 7 are turned OFF at the same time, and the charges stored in their parasitic capacitors are mutually charged or discharged. As a result, there is no change in the hold voltage sampled by hold capacitor $C_H$, and no error takes place.

In the above explanation, in the case of transition of sample and hold circuit 2 from the sampling operation to the hold operation, the low level is taken as the first logic level, and the high level is taken as the second logic level, and the XSEL signal makes logic inversion from the first logic level to the second logic level. In the following, the case will be explained when the SEL signal makes logic inversion from the second logic level to the first logic level.

In this way, when the low level is taken as the first logic level, amd the high level is taken as the second logic level, as the sample and hold circuit makes a transition from the hold operation to the sampling operation, the XSEL signal is inverted from the second logic level to the first logic level. Then, the SEL signal undergoes logic inversion from the first logic level to the second logic level. In this case, too, upon start of the logic inversion of the XSEL signal, changes in the logic level of OUT signal and the logic level of XOUT signal start; upon start of the logic inversion of the SEL signal, the logic level of the OUT signal and the logic level of the XOUT signal make further changes, so that inversions of the logic levels of the OUT signal and the XOUT signal start and complete at the same time, and hence it is possible to turn ON p-channel MOSFET 11$p$ and n-channel MOSFET 11$n$ of analog switch 7 at the same time.

On the other hand, when sample and hold circuit 2 switches from the hold state to the sampling state, p-channel MOSFET $M_7$ and n-channel MOSFET $M_1$ of said sample and hold circuit 3 are significantly related to the waveform shaping of the SEL signal and XSEL signal. However, they are little concerned in switch from the sampling state to the hold state. In sample and hold circuit 2, only when analog switch 7 is switched from the conductive state to the cutoff state is hold capacitor $C_H$ affected by charging or discharging of the parasitic capacitor. Consequently, when it is only necessary to prevent the error in the hold voltage, p-channel MOSFET $M_7$ and n-channel MOSFET $M_1$ are not needed.

Figure 3:
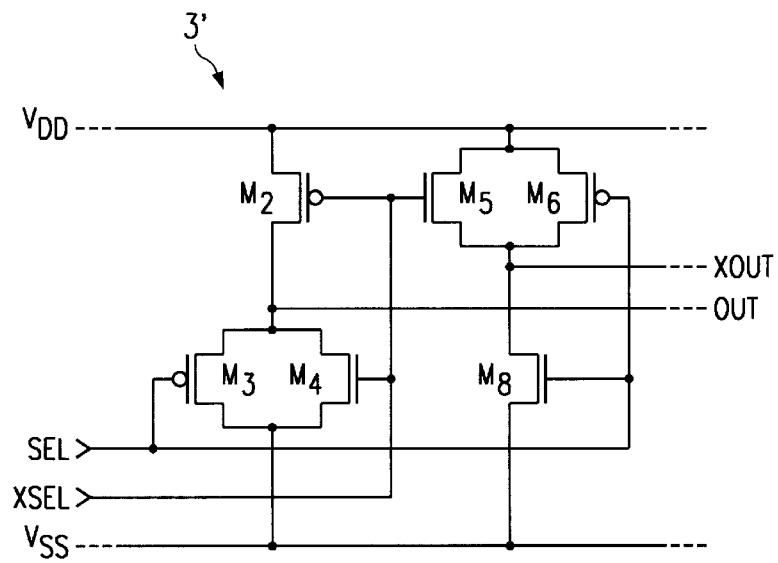
FIG. 3 is a circuit diagram illustrating another example of the waveform shaping circuit of this invention.
Figure 4A:
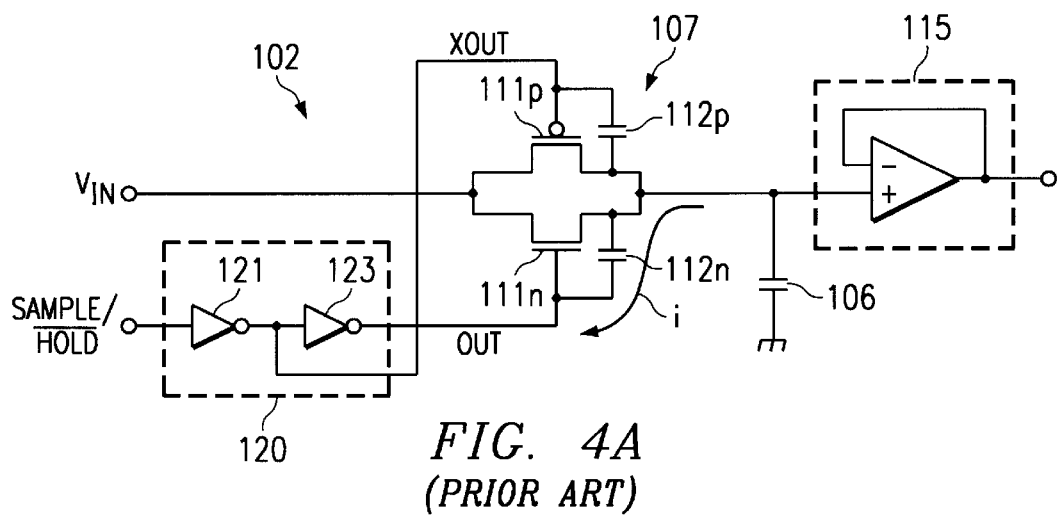
FIG. 4A is a circuit block diagram illustrating conventional technology.
Figure 4B:
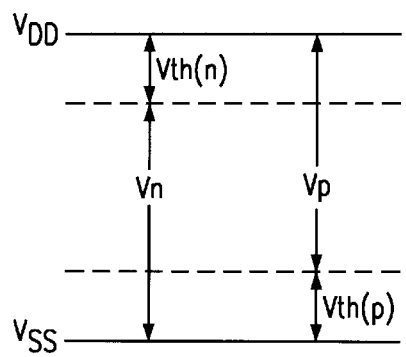
FIG. 4B is a diagram illustrating the amplitude of the analog switch.

In this case, n-channel MOSFET $M_1$ and p-channel MOSFET $M_7$ are deleted from waveform shaping circuit 3 to form a waveform shaping circuit represented by 3' in FIG. 3. It is then used as a sample and hold circuit.

Above, waveform shaping circuits 3, 3' are constructed of p-channel MOSFETs and n-channel MOSFETs. However, other elements, such as bipolar transistors may also be used to form the waveform shaping circuit in this invention. Also, waveform shaping circuits 3, 3' of this invention are not limited to the case of shaping of waveform input to analog switch 7. It may also be used widely in the circuits that require correction for the transmission delay of the SEL signal and XSEL signal in mutually opposite logic levels.

By using a simple circuit, it is possible to correct the transmission delay in the case of logic inversion of the XSEL signal and the SEL signal in mutually opposite logic levels.

In this way, the hold capacitor is not affected by the parasitic capacitance of the analog switch, and no error takes place in the hold voltage.

As there is no need to increase the size of the hold capacitor formed on the semiconductor IC, the chip can be made smaller, and the cost can be cut.

REFERENCE NUMERALS AND SYMBOLS AS SHOWN IN THE DRAWINGS

In the figures, 2 represents a Sample and hold circuit, 3 and 3' a Waveform shaping circuit, 7 an Analog switch, 11$_n$ an n-channel MOSFET, 11$_p$ a p-channel MOSFET, 23 an Inverter, $C_H$ a Hold capacitor.

I claim:

1. A sample and hold circuit comprising:
    a hold capacitor,
    an analog switch with an n-channel MOSFET and a p-channel MOSFET connected parallel to each other and connected to said hold capacitor, with the gates of said n-channel and said p-channel MOSFETs providing inputs to said analog switch,
    a waveform shaping circuit comprising:
        an XSEL signal and a SEL signal input, with the XSEL signal in a stable state in either a first logic level or a second logic level, with the second logic level opposite the first logic level, the logic level of said SEL signal is output as an OUT signal, the logic level of said XSEL signal is output as an XOUT signal, where said OUT signal and said XOUT signal are connected to the inputs of said analog switch;
        wherein in the transient state in which said XSEL signal starts logic inversion from the first logic level to the second logic level, and then said SEL signal starts logic inversion from the second logic level to the first logic level,
        upon detection of the start of logic inversion of said XSEL signal, a change is started for the logic level of said OUT signal and the logic level of said XOUT signal; then, upon detection of the start of logic inversion of said SEL signal, the logic level of said OUT signal and the logic level of said XOUT signal are further changed, and logic inversion of said OUT signal and logic inversion of said XOUT signal are completed, and
        wherein said SEL signal is formed when said XSEL signal is inverted by an inverter; and said analog switch has a constitution such that it is set to the conductive state and cutoff state corresponding to the logic level of said XOUT signal and the logic level of said OUT signal state; and said hold capacitor has a constitution such that when said analog switch is conductive, charging/discharge takes place at the voltage to be sampled; and, when said analog switch is in the cutoff state, the voltage is maintained.

2. A sample and hold circuit comprising:
    a hold capacitor,
    a switch having an n-channel MOSFET and a p-channel MOSFET connected parallel to each other and connected to said hold capacitor to insure when said switch is conductive, charging/discharge of said hold capacitor takes place from an input voltage to be sampled, and when switch is in the cutoff state, the hold capacitor's voltage is maintained; and
    a waveform shaping circuit which provide an OUT signal and XOUT signal to gate inputs of said n-channel MOSFET and said p-channel MOSFET of said switch, wherein the OUT signal and XOUT signal start logic inversion and complete logic inversion at substantially the same time.

3. The sample and hold circuit of claim 2 wherein said waveform shaping circuit has inputs SEL and XSEL, where XSEL is inverted to provide said SEL input.

4. The sample and hold circuit of claim 3 wherein said waveform shaping circuit comprises:
    four switches S1, S2, S3, and S4, where said switches S1 and S2 are are connected in series between a first and second voltage level, and said switches S3 and S4 are also connected in series between said first and second voltage level, and a line connected between said switches S1 and S2 provides output OUT and a line connected between said switches S3 and S4 provides output XOUT.

5. The sample and hold circuit of claim 4 wherein said switch S2 comprises an p-channel MOSFET M3 connected in parallel to a n-channel MOSFET M4, said switch S3 comprises a p-channel MOSFET M6 connected in parallel to a n-channel MOSFET M5, said switch S1 comprises a p-channel MOSFET M2 and switch S4 comprises a n-channel MOSFET M8, and wherein gates of M3, M6 and M8 are connected to input SEL and gates of M4, M2, and M5 are connected to input XSEL.

6. The sample and hold circuit of claim 4 wherein said switch S2 comprises an p-channel MOSFET M3 connected in parallel to a n-channel MOSFET M4, said switch S3 comprises a p-channel MOSFET M6 connected in parallel to a n-channel MOSFET M5, said switch S1 comprises a n-channel MOSFET M1 and a p-channel MOSFET M2 and said switch S4 comprises a n-channel MOSFET M8 a p-channel MOSFET M7, and wherein gates of M1, M3, M6 and M8 are connected to input SEL and gates of M7, M4, M2, and M5 are connected to input XSEL.

7. The sample and hold circuit of claim 2 wherein said waveform shaping circuit comprises:

four switches S1, S2, S3, and S4, where said switches S1 and S2 are are connected in series between a first and second voltage level, and said switches S3 and S4 are also connected in series between said first and second voltage level, and a line connected between said switches S1 and S2 provides output OUT and a line connected between said switches S3 and S4 provides output XOUT.

8. The sample and hold circuit of claim 7 wherein said switch S2 comprises an p-channel MOSFET M3 connected in parallel to a n-channel MOSFET M4, said switch S3 comprises a p-channel MOSFET M6 connected in parallel to a n-channel MOSFET M5, said switch S1 comprises a p-channel MOSFET M2 and switch S4 comprises a n-channel MOSFET M8, and wherein gates of M3, M6 and M8 are connected to an input SEL and gates of M4, M2, and M5 are connected to an input XSEL.

9. The sample and hold circuit of claim 7 wherein said switch S2 comprises an p-channel MOSFET M3 connected in parallel to a n-channel MOSFET M4, said switch S3 comprises a p-channel MOSFET M6 connected in parallel to a n-channel MOSFET M5, said switch S1 comprises a n-channel MOSFET M1 and a p-channel MOSFET M2 and said switch S4 comprises a n-channel MOSFET M8 a p-channel MOSFET M7, and wherein gates of M1, M3, M6 and M8 are connected to an input SEL and gates of M7, M4, M2, and M5 are connected to an input XSEL.

* * * * *